US012796421B2

(12) United States Patent
Lee et al.

(10) Patent No.: US 12,796,421 B2
(45) Date of Patent: Nov. 10, 2026

(54) INTERCONNECTION STRUCTURE AND MANUFACTURING METHOD THEREOF

(71) Applicant: Taiwan Semiconductor Manufacturing Company, Ltd., Hsinchu (TW)

(72) Inventors: Cheng-Chin Lee, Hsinchu (TW); Ting-Ya Lo, Hsinchu (TW); Chi-Lin Teng, Hsinchu (TW); Shao-Kuan Lee, Hsinchu (TW); Kuang-Wei Yang, Hsinchu (TW); Gary Hsu Wei Liu, Hsinchu (TW); Yen-Ju Wu, Hsinchu (TW); Jing-Ting Su, Hsinchu (TW); Hsin-Yen Huang, Hsinchu (TW); Hsiao-Kang Chang, Hsinchu (TW); Wei-Chen Chu, Hsinchu (TW); Shu-Yun Ku, Hsinchu (TW); Chia-Tien Wu, Hsinchu (TW); Ming-Han Lee, Hsinchu (TW); Hsin-Ping Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 380 days.

(21) Appl. No.: 18/376,594

(22) Filed: Oct. 4, 2023

(65) Prior Publication Data

US 2025/0118598 A1 Apr. 10, 2025

(51) Int. Cl.
*H10W 20/00* (2026.01)
*H10W 20/43* (2026.01)

(52) U.S. Cl.
CPC ....... *H10W 20/033* (2026.01); *H10W 20/062* (2026.01); *H10W 20/076* (2026.01); *H10W 20/43* (2026.01)

(58) Field of Classification Search
CPC ......... H01L 21/76843; H01L 21/76831; H01L 21/7684; H01L 23/528; H10W 20/033;
(Continued)

(56) References Cited

U.S. PATENT DOCUMENTS 6,462,152 B1 * 10/2002 Berardi .................. C08F 10/00 526/171
9,728,485 B1 * 8/2017 Lee .................... H01L 23/3736
(Continued)

FOREIGN PATENT DOCUMENTS

CN 114883250 A * 8/2022 ......... H01L 21/7682

OTHER PUBLICATIONS

David J. Elliott, Ultraviolet Laser Technology and Applications, 1995, Academic Press, Inc. Chapter 7—Annealing and Planarization, pp. 209-250 (Year: 1995).*

*Primary Examiner* — William B Partridge
*Assistant Examiner* — Erik A. Anderson
(74) *Attorney, Agent, or Firm* — Birch, Stewart, Kolasch & Birch, LLP

(57) ABSTRACT

An interconnection structure and a manufacturing method thereof are provided. The interconnection structure includes a first dielectric layer, a first conductive feature, a second dielectric layer, and a barrier layer. The first conductive feature is disposed on the first dielectric layer, the second dielectric layer is disposed on the first dielectric layer and surrounds the sidewalls of the first conductive feature, the barrier layer is disposed between the first dielectric layer and the second dielectric layer and between the sidewalls of the first conductive feature and the second dielectric layer.

20 Claims, 8 Drawing Sheets

(58) Field of Classification Search
CPC .. H10W 20/062; H10W 20/076; H10W 20/43
See application file for complete search history.

(56) References Cited

U.S. PATENT DOCUMENTS

| | | | | |
|---|---|---|---|---|
| 2015/0064901 | A1* | 3/2015 | Wakatsuki ........ | H01L 21/76886 438/655 |
| 2020/0312815 | A1* | 10/2020 | Morein .................. | H10D 88/00 |
| 2022/0246469 | A1* | 8/2022 | Tseng ..................... | H10D 1/043 |
| 2022/0310814 | A1* | 9/2022 | Hsiung ................ | H10D 64/518 |
| 2023/0130702 | A1* | 4/2023 | Shin .................. | H01L 21/76844 257/751 |
| 2024/0130242 | A1* | 4/2024 | Zhao ...................... | H10N 50/01 |

* cited by examiner

INTERCONNECTION STRUCTURE AND MANUFACTURING METHOD THEREOF

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

For manufacturing different conductive layers on the substrate, the self-aligned contact (SAC) process may be utilized to avoid misalignment. However, the integrated fabrication also brings out some issues, such as reliability, high capacitance, or high resistance because of larger portion of barrier at trench and high capacitance ESL of metal oxide. Furthermore, via misalignment in much smaller pitch (<20 nm) is getting worse in the future. The via misalignment will cause reliability issue of interconnection structure. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
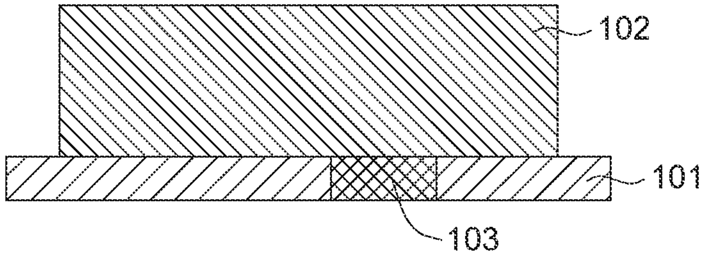
FIGS. 1A to 1F are schematic diagrams illustrating a method for manufacturing an interconnection structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIGS. 1A to 1F, schematic diagrams illustrating a method for manufacturing an interconnection structure 100 according to an embodiment of the present disclosure are provided. The interconnect structure 100 may be formed on various devices of a semiconductor structure. For example, interconnect structure 100 may be formed over one or more devices, such as transistors, diodes, image sensors, resistors, capacitors, inductors, memory cells, the above combinations, and/or other suitable devices. In some embodiments, the interconnection structure 100 may be formed over a transistor, such as a nanostructured field effect transistor having a plurality of channels surrounded by a gate electrode layer.

Figure 1B:
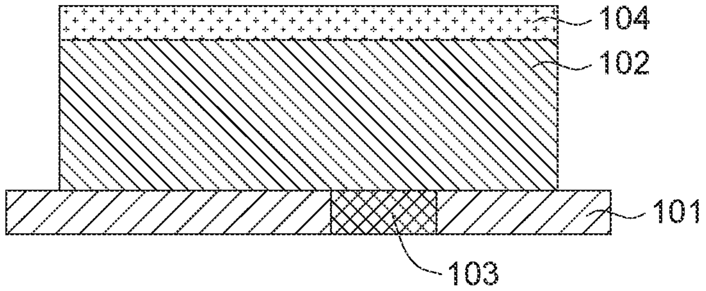
Figure 1C:
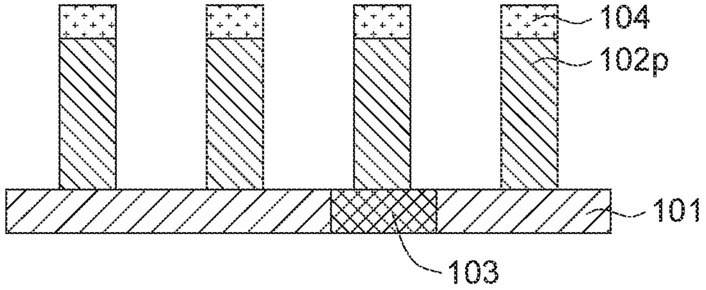
Figure 1D:
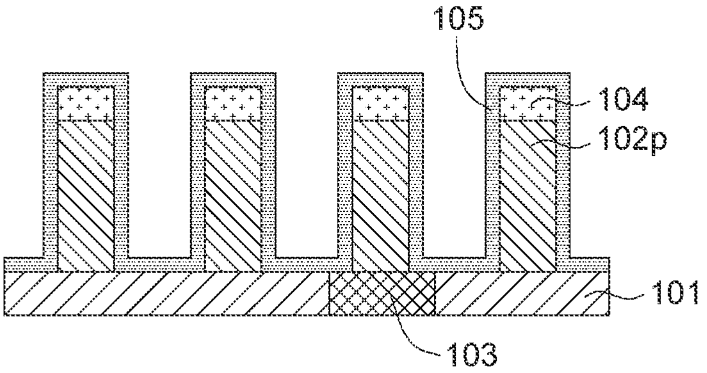
Figure 1E:
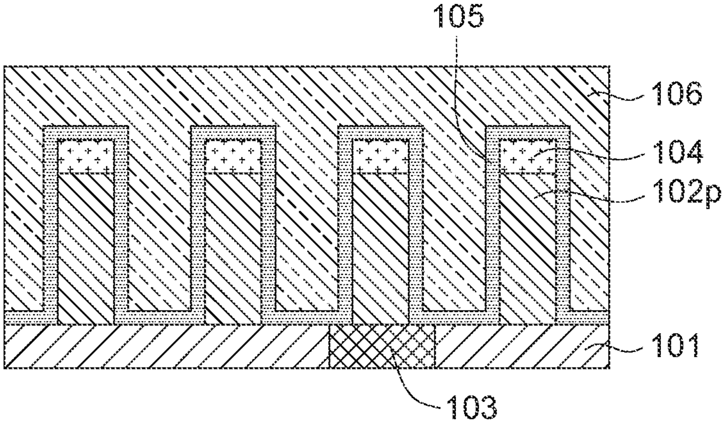
Figure 1F:
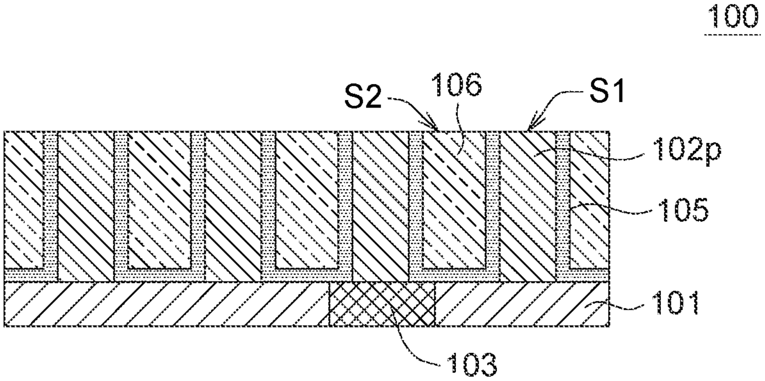

Referring first to FIG. 1F, the interconnection structure 100 includes a first dielectric layer 101, a first conductive feature 102*p*, a second dielectric layer 106 and a barrier layer 105. The first conductive feature 102*p* is disposed on the first dielectric layer 101, the second dielectric layer 106 surrounds the sidewall of the first conductive feature 102*p*, and the barrier layer 105 is disposed between the first dielectric layer 101 and the second dielectric layer 106 and between the sidewall of the first conductive feature 102*p* and the sidewall of the second dielectric layer 106. The following embodiments describe the method for manufacturing the interconnection structure 100 shown in FIGS. 1A to 1F.

First, in FIG. 1A, a first conductive metal 102 is formed on a first dielectric layer 101. In FIG. 1B, a hard mask layer 104 is formed on the first conductive metal 102. In FIG. 1C, the hard mask layer 104 is patterned and the first conductive metal 102 is partially etched to form a first conductive feature 102*p*, wherein the hard mask layer 104 overlies the top of the first conductive feature 102*p*. In FIG. 1D, a barrier layer 105 is formed on the top surface of the first dielectric layer 101, the sidewalls of the first conductive feature 102*p* and the hard mask layer 104 and the top of the hard mask layer 104. In FIG. 1E, a second dielectric layer 106 is formed on the barrier layer 105, and the second dielectric layer 106 surrounds the sidewalls of the first conductive feature 102*p*. In FIG. 1F, a planarization process is performed to remove the hard mask layer 104 and a part of the second dielectric layer 106 to expose the top surface S1 of the first conductive feature 102*p* and the top surface S2 of the second dielectric layer 106.

The first dielectric layer 101 and the second dielectric layer 106 can be formed by chemical vapor deposition (CVD), atomic layer deposition (ALD), spin coating or other suitable processes. form. The first dielectric layer 101 and the second dielectric layer 106 may be made of amorphous SiOx, SiOxCyHz, SiOxCy, SiCx or related low-k materials. The first conductive metal 102 may include electrically conductive materials, such as copper, cobalt, ruthenium, molybdenum, chromium, tungsten, manganese, rhodium, iridium, nickel, palladium, platinum, silver, gold, aluminum, alloys of the above, or others suitable materials. The hard mask layer 104 may include materials such as titanium nitride (TiN), tungsten nitride (WN), tungsten carbide (WC), silicon nitride (SiNx), or other suitable materials. The first conductive metal 102 can be deposited at a temperature between 300 degrees Celsius and 450 degrees Celsius by physical vapor deposition (PVD), chemical vapor deposition (CVD), atomic layer deposition (ALD), electroless deposition (ELD), electrochemical plating (ECP) or other suitable processes to form. The hard mask layer 104 can be formed by chemical vapor deposition (CVD), physical vapor deposition (PVD), atomic layer deposition (ALD) or other suitable processes at a temperature between 300° C. and 500° C.

The first conductive feature 102*p* may be formed by plasma etching, reactive ion etching (RIE), or other suitable processes. The first conductive feature 102*p* is, for example, a conductive post, which can be electrically connected to a conductive contact 103 (e.g., a source region or a drain region contact) under the interconnection structure 100. Generally speaking, after the first conductive metal 102 undergoes anisotropic etching, the first conductive feature 102*p* with high aspect ratio is formed. The anisotropic etching can use oxygen-containing gas, fluorine-containing gas, chlorine-containing gas, bromine-containing gas, iodine-containing gas, other suitable gases and/or plasmas, and/or combinations thereof. A suitable anisotropic etching process may be an ion beam etching (IBE) process with a power level between about 100 V and about 2000 V and a beam angle between about 0° and between about 70°, and the inert gas is selected from helium, neon, argon, krypton or xenon. Another suitable anisotropic etch process may be an inductively coupled plasma-reactive ion etch (ICP-RIE or RIE-ICP) process in which a transformer coupled plasma (TCP) power is between about 100 W and about between 1500 W, with a bias level between about 0 V and about 300 V, and one or more organic gases, such as acetic acid ($CH_3COOH$), methanol ($CH_3OH$), or ethanol ($C_2H_5OH$). Yet another suitable anisotropic etch process may be a RIE-ICP process with a transformer coupled plasma (TCP) power of between about 100 W to about 1500 W, a bias power between about 0 V and about 500 V, and fluorocarbon gases such as tetrafluoromethane ($CF_4$), trifluoromethane ($CHF_3$), difluoromethane ($CH_2F_2$), perfluorocyclobutane ($C_4F_8$) and/or hexafluorobutadiene ($C_4F_6$) and nitrogen, oxygen or argon. Yet another suitable anisotropic etch process may be a RIE process with a TCP power level between about 100 W and about 2000 W, a bias voltage between about 0 V and about 500 V, halogen or halogen substituted carbon compounds such as chlorine ($Cl_2$), chlorosilane ($SiCl_4$), chloroborane ($BCl_3$) and/or fluorocarbons (such as $CF_4$, $CHF_3$, $CH_2F_2$, $C_4F_8$, $C_4F_6$) and nitrogen, oxygen or argon.

The barrier layer 105 may include silicon oxycarbide, silicon carbonitride, silicon nitride, silicon oxynitride, silicon oxide, silicon carbide, silicon oxynitride or other suitable dielectric materials. The barrier layer 105 can be formed by chemical vapor deposition (CVD), physical vapor deposition (PVD), atomic layer deposition (ALD) or other suitable processes. The barrier layer 105 can prevent the first conductive metal 102 from causing metal diffusion to the subsequently formed dielectric material. The thickness of the barrier layer 105 is generally between about 10 nm and about 40 nm, and the trench width between the two first conductive features 102*p* will reduce about 2 nm to 8 nm.

The difference between the new conductive feature and the traditional conductive feature is that the traditional conductive feature is formed in the dielectric layer through dual damascene, single damascene, half damascene or other suitable processes. Taking the single damascene process as an example, the dielectric layer is etched to form openings according to a predefined pattern. Then, a barrier layer is deposited in the opening, and a conductive metal (e.g., copper) is deposited on the barrier layer. Thereafter, the upper surface of the conductive metal is planarized such that the conductive feature, barrier layer, and dielectric layer substantially stack to each other. In contrast, the first conductive feature 102*p* of this embodiment is formed by plasma etching, reactive ion etching (RIE) or other suitable processes, and then, a barrier layer 105 is comprehensively formed on the top surface of the first dielectric layer 101, the sidewalls of the first conductive feature 102*p* and the hard mask layer 104. The second dielectric layer 106 is comprehensively formed on the top surfaces of the barrier layer 105, the first conductive feature 102*p* and the hard mask layer 104.

After the planarization process, the top surface S1 of the first conductive feature 102*p*, the top surface of the barrier layer 105, and the top surface S2 of the second dielectric layer 106 are substantially coplanar. Subsequent interconnection structures are mainly stacked into double-layer, three-layer or more interconnection structures 110 based on the configuration of FIG. 1F. A method for manufacturing the double-layer stacked interconnection structure 110 is described according to FIGS. 2A to 2E or FIGS. 3A to 3E. The interconnection structure 110 shown in FIGS. 3A to 3E is similar to the interconnection structure 110 shown in FIGS. 2A to 2E, the difference is that the capping layer 111 in FIGS. 2A to 2E is graphene as an example, and the capping layer 111 in FIGS. 3A to 3E is self-assembled monolayer as an example.

Figure 3A:
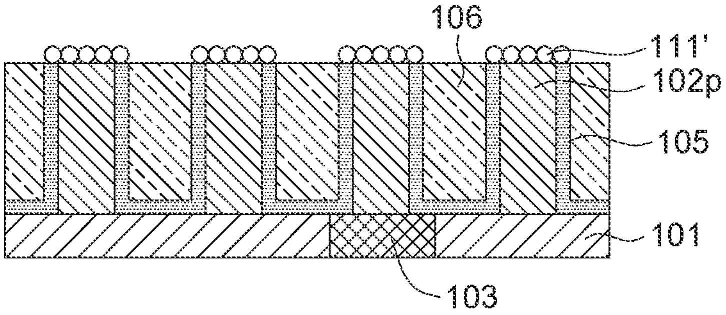
FIGS. 3A to 3E are schematic diagrams illustrating a method for manufacturing a double-layer stacked interconnection structure according to another embodiment of the present disclosure.
Figure 3B:
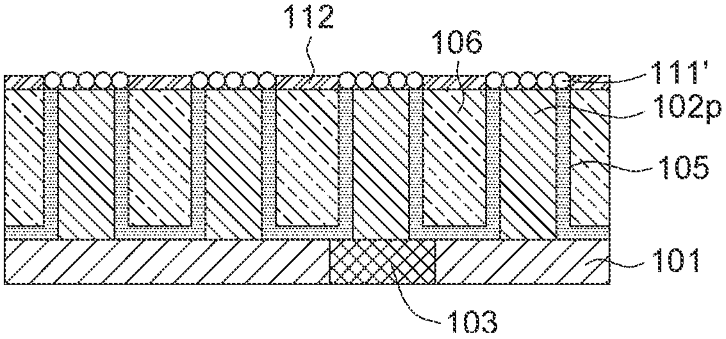
Figure 3C:
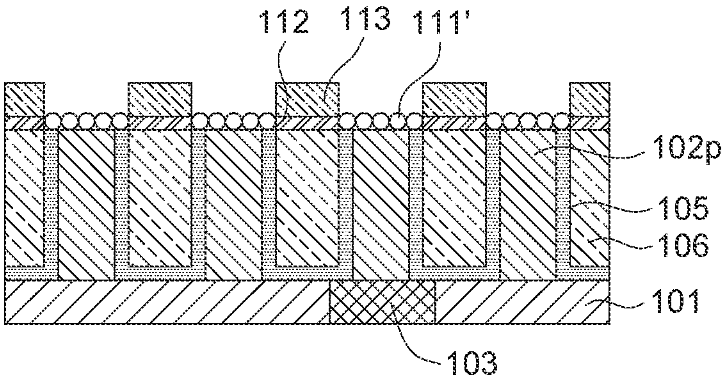
Figure 3D:
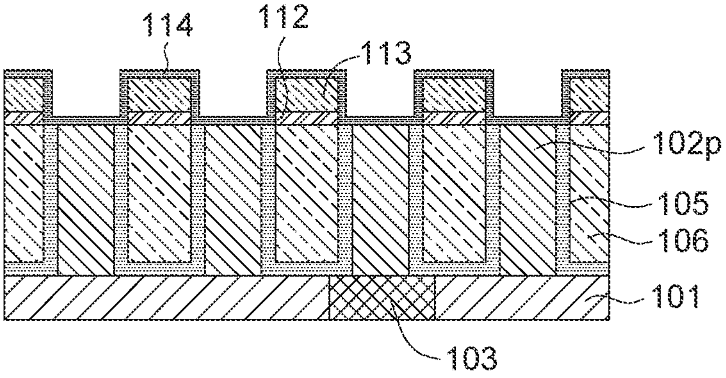
Figure 3E:
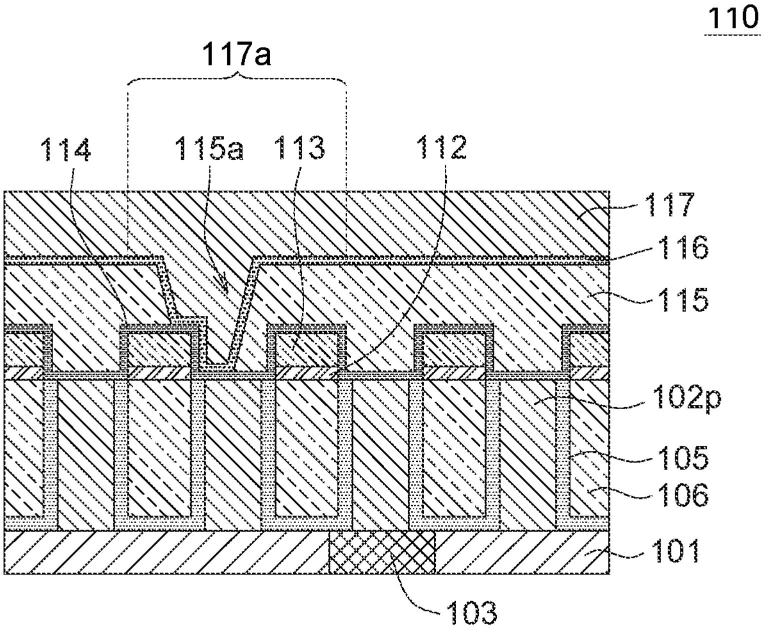
Figure 4:
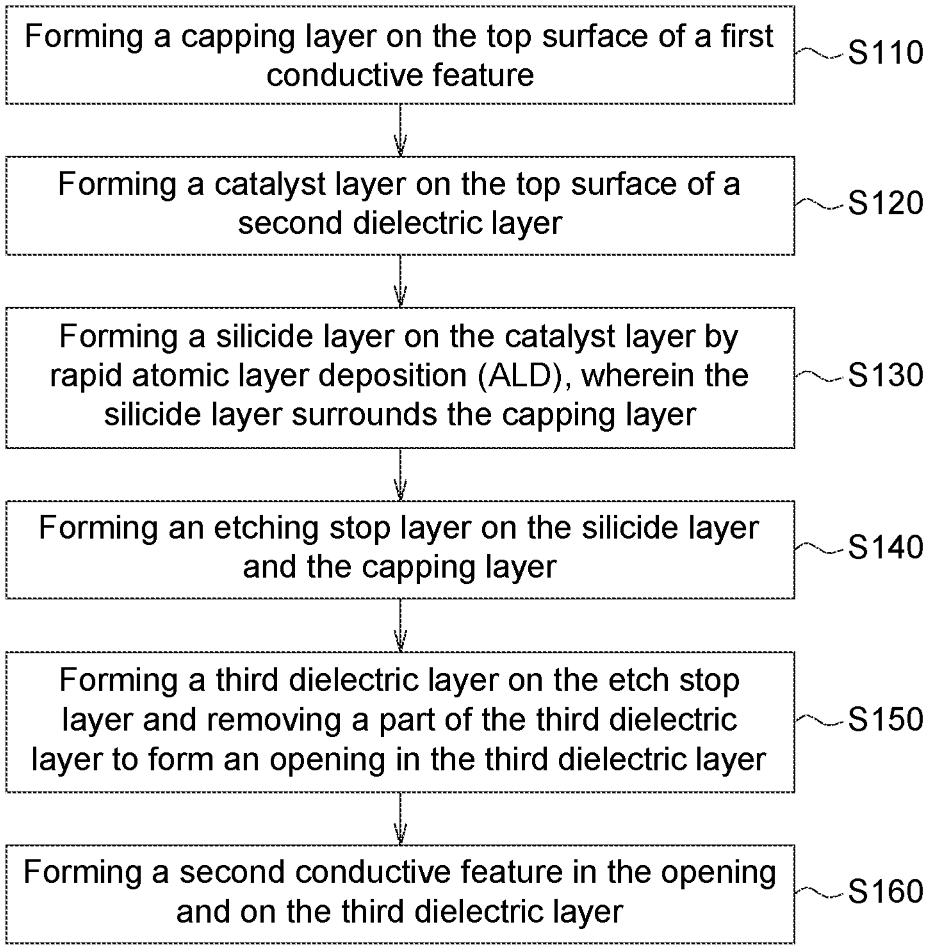
FIG. 4 is a flow chart of the method for manufacturing the interconnection structure.

FIG. 4 is a flowchart of an exemplary manufacturing method for interconnect structure 110 according to some embodiments. To illustrate the present disclosure, the cross-sectional schematic diagrams of the interconnection structure 110 in FIG. 2A to 2E or 3A to 3E and the manufacturing method in FIG. 4 will be described together. It can be understood that the operating steps shown in the manufacturing method are not exhaustive, and other operating steps can also be performed before, after or during any of the illustrated operating steps. Furthermore, some of the operational steps may be performed simultaneously or in an order different from that shown in FIGS. 2A to 2E, 3A to 3E, and 4.

Figure 2A:
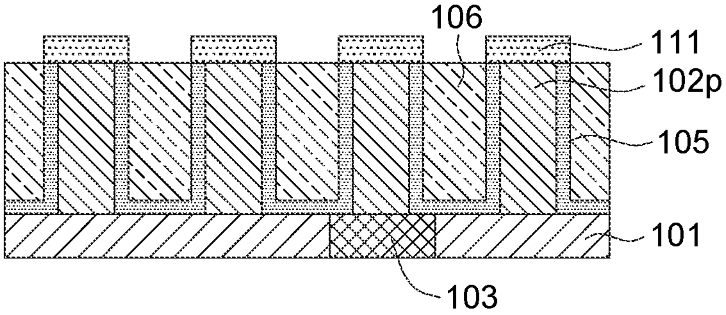
FIGS. 2A to 2E are schematic diagrams illustrating a method for manufacturing a double-layer stacked interconnection structure according to an embodiment of the present disclosure.
Figure 2B:
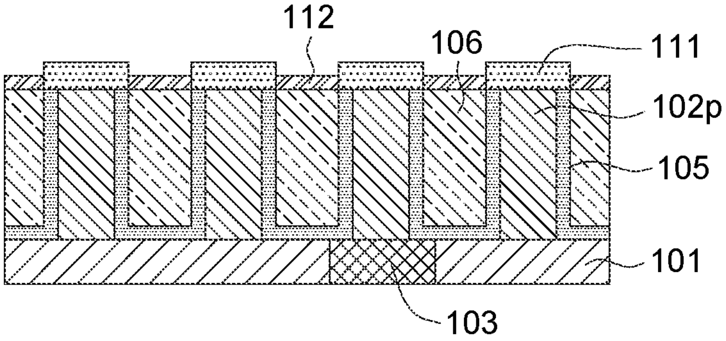
Figure 2C:
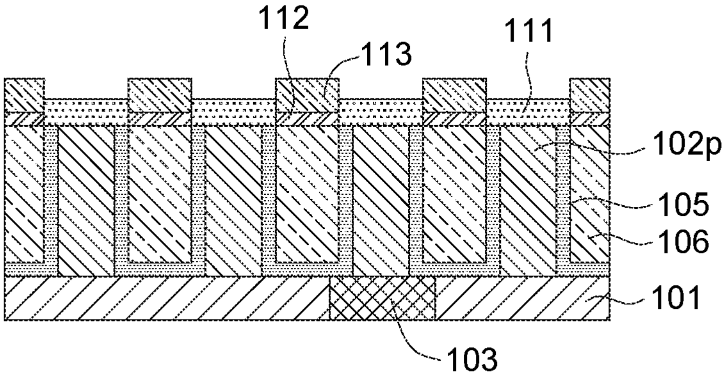
Figure 2D:
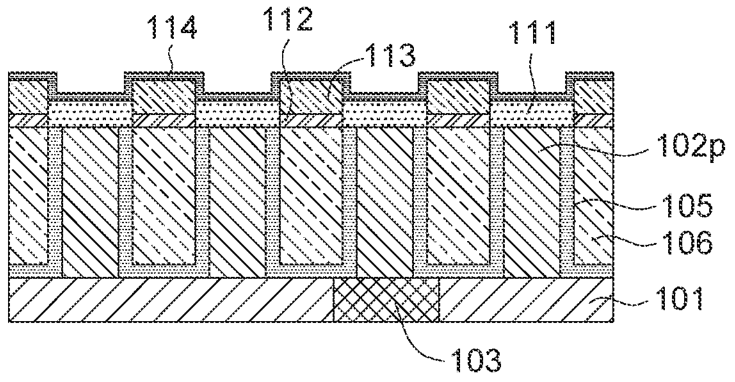
Figure 2E:
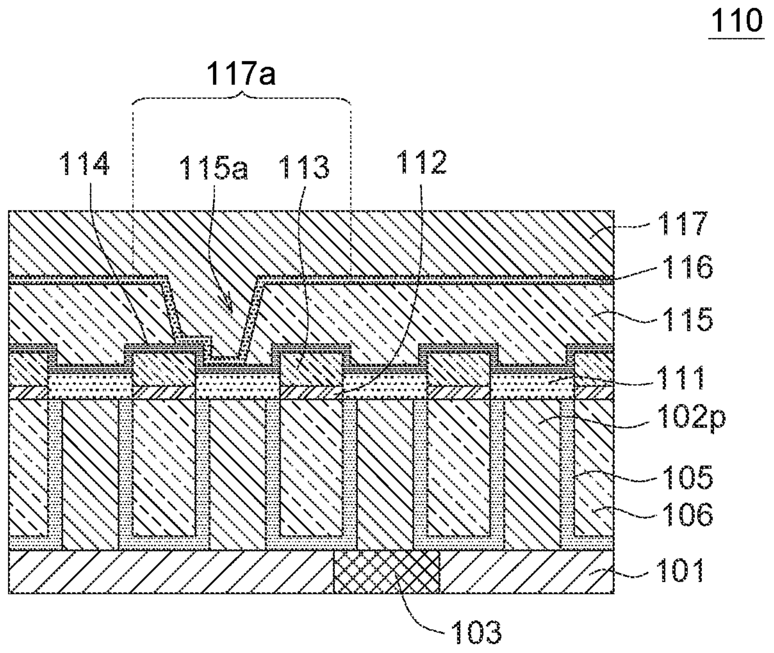

First, in FIG. 2A and step S110, a capping layer 111 is formed on the top surface of a first conductive feature 102*p*. In FIG. 2B and step S120, a catalyst layer 112 is formed on the top surface of the second dielectric layer 106. In FIG. 2C and step S130, a silicide layer 113 is formed on the catalyst layer 112 by rapid atomic layer deposition (ALD), wherein the silicide layer 113 surrounds the capping layer 111. In FIG. 2D and step S140, an etching stop layer 114 is formed on the silicide layer 113 and the capping layer 111. In FIG. 2E and step S150, a third dielectric layer 115 is formed on the etch stop layer 114, and a part of the third dielectric layer 115 is removed to form an opening 115*a* in the third dielectric layer 115. Afterwards, as shown in step S160, a second conductive feature 117*a* is formed in the opening 115*a* and on the top surface of the third dielectric layer 115.

In some embodiments, before forming the capping layer 111, a pretreatment process may be performed to facilitate the selective deposition of the capping layer 111 on the top surface of the first conductive feature 102*p*. The pretreatment process may be performed by contacting the interconnect structure 100 with $H_2$ plasmas formed from a hydrogen-containing precursor (e.g., hydrogen, ammonia, hydrocarbons, or the like, or any combination thereof).

In some embodiments, the capping layer 111 may include two-dimensional (2D) materials, as shown in FIG. 2A. The term "two-dimensional material" used in this disclosure refers to a single-layer material or a mono-layer type material, which is an atomically thin crystalline solid having interlayer covalent bonds and interlayer van der Waals bonds. Examples of two-dimensional materials may include graphene, hexagonal boron nitride (h-BN) or transition metal dichalcogenides ($MX_2$), where M is a transition metal element and X is a chalcogen element. Some exemplary transition metal dichalcogenide ($MX_2$) materials can include, but are not limited to, Hf, $Te_2$, $WS_2$, $MoS_2$, $WSe_2$, $MoSe_2$, or any combination thereof. In some embodiments, the capping layer 111 may include graphene. In some embodiments, the capping layer 111 may be formed by atomic layer deposition (ALD) or other suitable processes at a temperature between 150 degrees Celsius and 400 degrees Celsius. In some embodiments, capping layer 111 may prevent diffusion of metal from first conductive feature 102*p* into the second dielectric layer 106.

In addition, as shown in FIG. 3A, the capping layer 111' may include a self-assembled monolayer (SAM), which is formed only on the first conductive feature 102*p* and not formed on the second dielectric layer 106. The SAM can be thiol (—SH), phosphonic acid (—POOH) or benzoate SAM, another SAM with specific functional groups may attach to the first conductive feature 102*p* but not to the second dielectric layer 106. The self-assembled monolayer 110 may be formed by a chemical vapor deposition (CVD), or a wet process such as spin coating, spraying or dip coating, or other suitable processes. The self-assembled monolayer (SAM) may be removed by a dry etching process, a wet etching process or other suitable processes before the subsequent formation of the etch stop layer 114.

As shown in FIGS. 2B and 3B, the catalyst layer 112 is, for example, trimethylaluminum (TMA), which reacts chemically with the hydroxylated surface of the second dielectric layer 106 to form a surface containing methylaluminum. Subsequently, tri(tert-butoxy)silanol (TBS) is introduced to convert silanol molecules into siloxane polymers through the catalyst layer 112. The cross-linking reaction of siloxane polymers may be achieved by eliminating the water between adjacent hydroxyl groups, and finally solidified into the silicide layer 113 (such as $SiO_2$). Therefore, in this embodiment, a silicide layer 113 may be formed on the surface containing aluminum methyl by rapid atomic layer deposition (ALD).

As shown in FIGS. 2C and 3C, the silicide layer 113 is, for example, silicon dioxide, which is formed on the catalyst layer 112 by rapid atomic layer deposition (ALD). The $SiO_2$ deposition technology of this embodiment is different from the traditional $SiO_2$ deposition technology in that: the traditional $SiO_2$ deposition technology has high growth temperature (greater than 400° C.), particle generation, poor surface coverage and low deposition rate. The rapid $SiO_2$ ALD deposition technique in this embodiment uses silanol and aluminum catalysts to deposit $SiO_2$ thin films. While maintaining the self-limiting behavior, the growth rate of the $SiO_2$ film in the rapid ALD is more than 100 times higher than that of traditional $SiO_2$ thermal ALD. This embodiment uses tri(tert-butoxy)silanol (TBS) or tri(tert-amyloxy)silanol (TPS) to accomplish rapid $SiO_2$ ALD in the temperature range about 200° C.

The SiO2 film of this embodiment uses tri(tert-butoxy) silanol (TBS) and trimethylaluminum (TMA) as silicon oxide source and catalyst respectively to deposit amorphous, transparent and conformal SiO2 film. The growth rate of SiO2 thin film increase rapidly to a maximum at 200° C., and the rapid SiO2 ALD is considered to be the result of the growth of siloxane polymer chains under the catalysis of aluminum.

Figure 5:
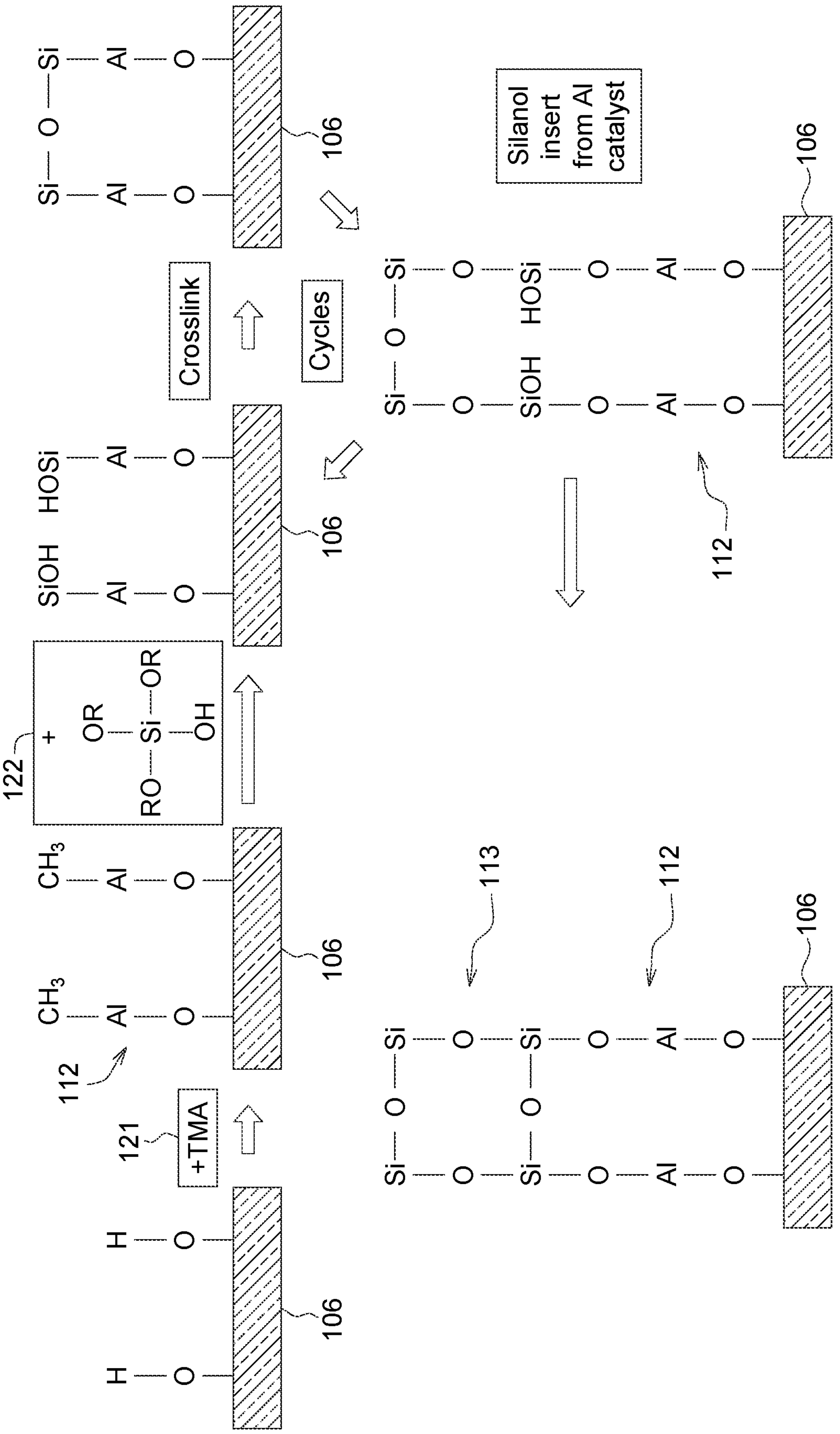
FIG. 5 is a schematic diagram of a method for forming silicide according to an embodiment of the present disclosure.

As shown in FIG. 5, rapid SiO2 atomic layer deposition (ALD) may provide with very thick and conformal SiO2 films by exposing silanol to a surface covered with an Al catalyst layer 112. In one embodiment, the thicknesses of SiO2 ALD may be between 125 Å and 140 Å at lower deposition temperatures of 150° C. and 175° C. and at a pressure of about 1 Torr. In one embodiment, the thickness of SiO2 ALD may be 100 Å in 120 seconds per cycle at a deposition temperature of 200° C.

As shown in FIG. 5, trimethylaluminum (TMA) 121 undergoes chemical adsorption reaction with the hydroxylated surface of the second dielectric layer 106. Tris(tert-butoxy)silanol (TBS) 122 is then chemisorbed onto the methylaluminum-containing surface during the reaction and methane is eliminated. Additional silanol molecules can then diffuse down to the methylaluminum-containing surface and insert into the aluminum-oxygen bond via a coordinated mechanism. Repeated insertion of silanol into the aluminum-oxygen bond forms a siloxane polymer that binds the surface through the aluminum. This siloxane polymer is attached to the surface by strong chemical bonds and therefore does not evaporate. This conversion of volatile silanols to non-volatile siloxane polymers is an irreversible chemisorption process. Since silanols may diffuse through this soft surface-bound siloxane polymer, the aluminum atoms may still catalyze the polymerization of more silanol molecules. The rate-limiting step in the process is the catalytic conversion of silanols to siloxanes, provided the concentration of silanol vapor is high enough to keep the catalytic aluminum atoms fully occupied. In this case, the rate of chemisorption does not depend on the rate at which silanols reach the surface of the siloxane layer. This condition of the concentration of silanol vapor is important for producing uniformly thick films regardless of the inhomogeneity of the silanol vapor distribution on the surface. According to the following reaction, the self-limiting nature of the ALD reaction is caused by the crosslinking of the siloxane polymer. First, the tert-butyl group on the siloxane is thermally decomposed by hydrogen elimination of isobutylene, leaving a hydroxyl group on the silicon. The newly formed hydroxyl group may transfer a hydrogen atom to a nearby butoxyl group, eliminating tert-butanol and crosslinking silicon through an oxygen atom. Cross-link reaction may also be achieved by dehydrating between two adjacent hydroxyl groups.

These crosslinking reactions link the siloxane polymer chains, causing the siloxane polymer layer to gel and eventually solidify to silicon dioxide ($SiO_2$). Since the rate of diffusion of silanols through the solid silica is likely to be negligible, additional silanols can no longer reach the catalytic aluminum atoms, and thus the chemisorption of silanols eventually ceases (becomes self-limiting nature). Sufficient hydroxyl groups remain on the surface of the silicon dioxide ($SiO_2$) so that the cycle can begin again by reacting with the next dose of trimethylaluminum (TMA).

As shown in FIGS. 2D and 3D, the etch stop layer 114 may be made of a material with a low dielectric constant (k is less than 3.9). In the field of semiconductor device structure and manufacturing process, high k can refer to a dielectric constant greater than that of $SiO_2$ (For example, greater than about 3.9). The etch stop layer 114 may include SiON, silicon oxide (SiOx), SiNx or other suitable materials, which may be deposited at a temperature between 150 degrees Celsius and 400 degrees Celsius by chemical vapor deposition (CVD), physical vapor deposition (PVD), atomic layer deposition (ALD) or other suitable processes.

As shown in FIGS. 2E and 3E, a portion of the third dielectric layer 115 is removed to form an opening 115*a* in the third dielectric layer 115 to expose the capping layer 111 or 111' above the first conductive feature 102*p*. A liner 116 is formed on the top surface of the capping layer 111, on the sidewall of the opening 115*a* and on the third dielectric layer 115. Since the capping layer 111 may be formed of a two-dimensional material, and the two-dimensional material (for example, graphene) has a low contact resistance, it is not necessary to remove the capping layer 111 above the first conductive feature 102*p* when forming the opening 115*a*. In some embodiments, the opening 115*a* can be formed by dry etching, wet etching or other suitable processes. In some embodiments, the liner 116 may include SiOxCy, SiC, SiN or other suitable materials. In some embodiments, the liner 116 may be formed by chemical vapor deposition (CVD), physical vapor deposition (PVD), atomic layer deposition (ALD) or other suitable processes at a temperature between 150 degrees Celsius and 400 degrees Celsius.

Before forming the liner 116, a pretreatment process (for example, the aforementioned $H_2$ plasma treatment) may be performed on the third dielectric layer 115 and the capping layer 111. The pretreatment process may be performed by contacting the interconnect structure 110 with an $H_2$ plasma formed from a hydrogen-containing precursor (e.g., hydrogen, ammonia, hydrocarbons, or the like, or any combination thereof). For example, $H_2$ plasma can change the surface function of the capping layer 111 by reducing the number of unwanted hydroxyl groups on the graphene surface, and provide strong chemical modification of graphene through surface hydrogenation. The hydrophobicity of the treated graphene surface leads to a delay in the nucleation of the liner 116. For example, during the deposition of the liner 116, HfOx will bond with the third dielectric layer 115 more easily than the treated graphene surface. Therefore, the pretreatment process helps to selectively deposit the liner 116 on the third dielectric layer 115. By performing $H_2$ plasma treatment, the surface of the third dielectric layer 115 (for example, SiOx, SiOxCyHz, SiOxCy or SiCx) and the capping layer 111 (for example, two-dimensional material) may have different liner deposition selectivity (for example, HfOx). Therefore, as shown in FIGS. 2E and 3E, the liner 116 is formed on the sidewall of the opening 115*a* and on the third dielectric layer 115, and the liner 116 can be optionally formed on the capping layer 111.

As shown in FIGS. 2E and 3E, the second conductive metal 117 is formed in the opening 115*a* and on the top of capping layer 111 and the lining layer 116. In some embodiments, the second conductive metal 117 may include Ru, Mo, related alloys or other suitable materials, and the materials of the first and second conductive metals 102 and 117 may be the same or different. In some embodiments, the second conductive metal 117 can be deposited between 150 degrees Celsius and 400 degrees Celsius by chemical vapor deposition (CVD), physical vapor deposition (PVD), atomic layer deposition (ALD), electroless deposition (ELD), electrochemical plating (ECP) or other suitable processes. Then, a portion of the second conductive metal 117 may be removed to form a second conductive feature 117*a* on the capping layer 111 and the first conductive feature 102*p*. For example, a patterned mask may be disposed on the second conductive metal 117 and expose a portion of the second conductive metal 117 to be removed. Then, an etching operation step is performed to remove the second conductive metal 117 and the liner 116 not covered by the mask, and form a second conductive feature 117*a* on the top of the first conductive feature 102*p*.

In some embodiments, the second conductive feature 117*a* may be formed by dual damascene, single damascene, half damascene, or other suitable processes. In some embodiments, the second conductive feature 117*a* may be formed by a half damascene process. In some embodiments, the second conductive feature 117*a* may include a via connection structure within the opening 115*a* and a conductive line on the via connection structure. In some embodiments, the via connection structure and the conductive line may be formed of the same material.

It can be understood that the interconnection structures 100 and 110 are not limited to be directly formed on the semiconductor device (not shown). Other structures (e.g., middle end of the line (MEOL) structures) may be formed between the interconnection structures 100, 110 and the semiconductor device. Therefore, the interlayer dielectric layer (for example, the first dielectric layer 101, the second dielectric layer 106 and the third dielectric layer 115) of the interconnection structures 100, 110 can be any layer in the interlayer dielectric layers.

Moreover, the first dielectric layer 101, the second dielectric layer 106 and the third dielectric layer 115 may include or be made of a dielectric material having ordered pores, and these materials are characterize by a low dielectric constant and a high mechanical strength. Therefore, the k value of the first dielectric layer 101, the second dielectric layer 106 and the third dielectric layer 115 can be reduced, and the capacitance of the interconnection structures 100 and 110 can also be reduced. In the case of misalignment, as shown in FIGS. 2E and 3E, it is advantageous to use a dielectric material with ordered porosity. For example, in some embodiments, when the opening 115*a* is misaligned with the first conductive feature 102*p*, since the material of the second dielectric layer 106 is a low-k material with ordered pores (which has a higher mechanical strength) and the top surface of the second dielectric layer 106 is covered with a silicide layer 113 (such as $SiO_2$), which can prevent the opening 115*a* from breaking through the second dielectric layer 106 and exposing the second dielectric layer 106. Therefore, when via misalignment occurs, especially when the trench width is less than 20 nm, the second conductive feature 117*a* can still be formed on the top of the first conductive feature 102*p* with the protection of the silicide layer 113 to improve the reliability of the interconnection structure 110.

The present disclosure relates to an interconnection structure and a manufacturing method thereof. The new conductive feature may be formed by deep etching (such as chemical ion etching, RIE), which is different from traditional conductive feature that is formed in the dielectric layer through dual damascene, single damascene, semi-damascene or other suitable processes. In addition, in the present disclosure, Tri(tert-butoxy) silanol (TBS) and trimethylaluminum (TMA) are used as silicon oxide source and catalyst to deposit SiO2 thin film on the dielectric layer and becomes the dielectric layer on the dielectric layer (DoD), which may grow faster than a traditional $SiO_2$ thermal ALD and in a lower temperature range (about 200° C.), which can solve the problem of traditional $SiO_2$ deposition technology with high growth temperature (greater than 400° C.), particle generation, poor surface coverage and low deposition rates.

According to some embodiments of the present disclosure, a method for manufacturing an interconnection structure including the following steps is provided. A first conductive metal is formed on a first dielectric layer. A hard mask layer is formed on the first conductive metal. The hard mask layer is patterned and the first conductive metal is partially etched to form a first conductive feature. A barrier layer is formed on the first dielectric layer, sidewalls of the first conductive feature, and the hard mask layer. A second dielectric layer is formed on the barrier layer, the first conductive feature, and the hard mask layer. A planarization process is performed to remove the hard mask layer and a portion of the second dielectric layer to expose the top surface of the first conductive feature and the top surface of the second dielectric layer.

According to some embodiments of the present disclosure, an interconnection structure is provided, which includes a first dielectric layer, a first conductive feature, a second dielectric layer, and a barrier layer. The first conductive feature is disposed on the first dielectric layer, the second dielectric layer is located on the first dielectric layer and surrounds the sidewalls of the first conductive feature, the barrier layer is disposed between the first dielectric layer and the second dielectric layer and between the sidewalls of the first conductive feature and the sidewalls of the second dielectric layer.

According to some embodiments of the present disclosure, a method for forming silicide on an interconnect structure is provided. The interconnection structure includes a dielectric layer and a conductive feature. The method for forming silicide includes the following steps. A capping layer is formed on a top surface of the conductive feature. A catalyst layer is formed on a top surface of the dielectric layer. A silicide layer is formed on the catalyst layer by rapid atomic layer deposition (ALD), wherein the silicide layer surrounds the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an interconnection structure, comprising:
- forming a first conductive metal on a first dielectric layer;
- forming a hard mask layer on the first conductive metal;
- patterning the hard mask layer and partially etching the first conductive metal to form a first conductive feature;
- forming a barrier layer on the first dielectric layer, sidewalls of the first conductive feature, and the hard mask layer;
- forming a second dielectric layer on the barrier layer, the first conductive feature, and the hard mask layer;
- performing a planarization process to remove the hard mask layer and a portion of the second dielectric layer to expose a top surface of the first conductive feature and a top surface of the second dielectric layer;
- forming a capping layer only on the top surface of the first conductive feature;
- forming a catalyst layer on the top surface of the second dielectric layer, wherein the capping layer and the catalyst layer do not overlap; and
- forming a silicide layer on the catalyst layer, wherein forming the silicide layer comprises using tris(tert-butoxy) silanol (TBS) and trimethylaluminum (TMA) as a source and a catalyst respectively.

2. The method according to claim 1, wherein the first conductive feature is a conductive post, and before the planarization process, the hard mask layer overlies the top surface of the first conductive feature, and the second dielectric layer surrounds the sidewalls of the first conductive feature.

3. The method according to claim 1, wherein the top surface of the first conductive feature and the top surface of the second dielectric layer are coplanar.

4. The method according to claim 1, wherein the first conductive feature is formed by reactive ion etching.

5. The method according to claim 1, further comprising:
- forming the silicide layer on the catalyst layer by a rapid atomic layer deposition (ALD), wherein the silicide layer surrounds the capping layer;
- forming an etch stop layer on the silicide layer and the capping layer;
- forming a third dielectric layer on the etch stop layer, removing a portion of the third dielectric layer to form an opening in the third dielectric layer; and
- forming a second conductive feature in the opening and on the third dielectric layer.

6. The method according to claim 5, wherein the capping layer comprises graphene or a self-assembled monolayer.

7. The method according to claim 5, wherein the catalyst layer comprises trimethylaluminum (TMA).

8. The method according to claim 5, after removing the portion of the third dielectric layer, the method further comprising:
- exposing the capping layer overlying the first conductive feature;
- forming a liner on a top surface of the capping layer, sidewalls of the opening and the third dielectric layer; and
- forming a second conductive metal in the opening and on the liner.

9. The method according to claim 5, before forming the etching stop layer, the method further comprising:
- removing the capping layer overlying the first conductive feature.

10. The method according to claim 9, after removing the portion of the third dielectric layer, the method further comprising:
- exposing the etch stop layer overlying the first conductive feature;
- forming a liner on a top surface of the etch stop layer, sidewalls of the opening and the third dielectric layer; and
- forming a second conductive metal in the opening and on the liner.

11. The method according to claim 10, after forming the second conductive metal, the method further comprising:
- forming a patterned mask on the second conductive metal;

performing etching to remove a portion of the second conductive metal to form the second conductive feature on top of the first conductive feature.

12. An interconnection structure comprising:

a first dielectric layer;

a first conductive feature disposed on the first dielectric layer;

a second dielectric layer disposed on the first dielectric layer, wherein the second dielectric layer surrounds sidewalls of the first conductive feature;

a barrier layer disposed between the first dielectric layer and the second dielectric layer and between the sidewalls of the first conductive feature and the second dielectric layer;

a capping layer disposed only on a top surface of the first conductive feature;

a catalyst layer disposed on a top surface of the second dielectric layer, wherein the capping layer and the catalyst layer do not overlap, and the catalyst layer is formed from trimethylaluminum (TMA); and a silicide layer disposed on the catalyst layer, wherein the silicide layer is formed from a silanol-containing silicon precursor including tris(tert-butoxy) silanol (TBS) on the catalyst layer.

13. The interconnection structure according to claim 12, wherein the capping layer comprises graphene or a self-assembled monolayer.

14. The interconnection structure according to claim 12, further comprising a second conductive feature disposed on the first conductive feature and the capping layer.

15. A method for forming silicide on an interconnect structure, the interconnection structure comprising a dielectric layer and a conductive feature, the method for forming silicide comprising:

forming a capping layer only on a top surface of the conductive feature;

forming a catalyst layer on a top surface of the dielectric layer, wherein the capping layer and the catalyst layer do not overlap; and forming a silicide layer on the catalyst layer by rapid atomic layer deposition (ALD), wherein the silicide layer surrounds the capping layer, and forming the silicide layer comprises using tris(tert-butoxy) silanol (TBS) and trimethylaluminum (TMA) as a source and a catalyst respectively.

16. The method for forming silicide according to claim 15, wherein the capping layer comprises a self-assembled monolayer.

17. The method for forming silicide according to claim 15, wherein the capping layer is formed before the catalyst layer is formed.

18. The method for forming silicide according to claim 15, wherein forming the silicide layer comprises:

subjecting a hydroxylated surface of the second dielectric layer to trimethylaluminum (TMA) to form a methylaluminum-containing surface via a chemical adsorption reaction; and supplying tris(tert-butoxy) silanol (TBS) such that the TBS is chemisorbed onto the methylaluminum-containing surface with elimination of methane.

19. The method according to claim 1, wherein the capping layer is formed before the catalyst layer is formed.

20. The method according to claim 1, wherein forming the silicide layer comprises:

subjecting a hydroxylated surface of the second dielectric layer to trimethylaluminum (TMA) to form a methylaluminum-containing surface via a chemical adsorption reaction; and supplying tris(tert-butoxy) silanol (TBS) such that the TBS is chemisorbed onto the methylaluminum-containing surface with elimination of methane.

* * * * *